US 11,177,406 B2

(12) United States Patent
Lim

(10) Patent No.: US 11,177,406 B2
(45) Date of Patent: Nov. 16, 2021

(54) SOLAR CELL AND SOLAR CELL MODULE USING THE SAME

(71) Applicant: LG ELECTRONICS INC., Seoul (KR)

(72) Inventor: Chunghyun Lim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 260 days.

(21) Appl. No.: 15/893,221

(22) Filed: Feb. 9, 2018

(65) Prior Publication Data

US 2018/0233615 A1    Aug. 16, 2018

(30) Foreign Application Priority Data

Feb. 13, 2017 (KR) .................. 10-2017-0019663

(51) Int. Cl.
| | |
|---|---|
| *H01L 31/05* | (2014.01) |
| *H01L 31/0224* | (2006.01) |
| *H01L 31/068* | (2012.01) |
| *H01L 31/048* | (2014.01) |

(52) U.S. Cl.
CPC .. *H01L 31/0508* (2013.01); *H01L 31/022441* (2013.01); *H01L 31/048* (2013.01); *H01L 31/0504* (2013.01); *H01L 31/0516* (2013.01); *H01L 31/0682* (2013.01); *Y02E 10/547* (2013.01)

(58) Field of Classification Search
CPC ......... H01L 31/0201; H01L 31/022425; H01L 31/022433; H01L 31/0488; H01L 31/05; H01L 31/0508; H01L 31/0516; H01L 31/022441; H01L 31/048; H01L 31/0504; H01L 31/0682; Y02E 10/547
See application file for complete search history.

(56) References Cited

U.S. PATENT DOCUMENTS

| | | | |
|---|---|---|---|
| 2006/0033214 A1* | 2/2006 | Tomono | ................. H01L 24/83 257/772 |
| 2011/0041908 A1 | 2/2011 | Harder et al. | |
| 2015/0059822 A1 | 3/2015 | Krokoszinski | |
| | | (Continued) | |

FOREIGN PATENT DOCUMENTS

| | | |
|---|---|---|
| EP | 2824712 A1 | 11/2013 |
| EP | 3142156 A1 | 3/2017 |
| | (Continued) | |

*Primary Examiner* — Mayla Gonzalez Ramos
(74) *Attorney, Agent, or Firm* — Birch, Stewart, Kolasch & Birch, LLP

(57) ABSTRACT

A solar cell and a solar cell module are disclosed. The solar cell module includes a plurality of solar cells each including a semiconductor substrate and first and second electrodes on the semiconductor substrate, the first and second electrodes being alternately positioned in a first direction and extended in a second direction intersecting the first direction, a first conductive line extended in the first direction to intersect the first and second electrodes, connected to the first electrode by a first conductive layer, and insulated from the second electrode by an insulating layer, and a second conductive line positioned in parallel with the first conductive line, connected to the second electrode by the first conductive layer, and insulated from the first electrode by the insulating layer.

12 Claims, 13 Drawing Sheets

(56) References Cited

U.S. PATENT DOCUMENTS

2015/0068592 A1* 3/2015 Kommera ........... H01L 31/0516
                                                     136/256
2018/0033904 A1* 2/2018 Adachi ............... H01L 31/0745

FOREIGN PATENT DOCUMENTS

| JP | 2010-129675 A | 6/2010 |
| JP | 2010-272725 A | 12/2010 |
| JP | 2015-159286 A | 9/2015 |
| JP | 2016-21478 A | 2/2016 |
| JP | 2017-5041 A | 1/2017 |
| WO | WO 2014/176380 A1 | 10/2014 |

* cited by examiner

SOLAR CELL AND SOLAR CELL MODULE USING THE SAME

CROSS-REFERENCE TO RELATED APPLICATION

This application claims priority benefit of Korean Patent Application No. 10-2017-0019663 filed in the Korean Intellectual Property Office on Feb. 13, 2017, the entire contents of which are incorporated herein by reference in its entirety.

BACKGROUND OF THE INVENTION

Field of the Invention

Embodiments of the invention relate to a solar cell having an improved structure and a solar cell module using the same.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy are attracting attention as next generation cells.

A solar cell generally includes semiconductor parts, which respectively have different conductivity types, for example, a p-type and an n-type and thus form a p-n junction, and electrodes respectively connected to the semiconductor parts of the different conductivity types.

When light is incident on the solar cell, a plurality of electron-hole pairs are produced in the semiconductor parts and are separated into electrons and holes by the incident light. The electrons move to the n-type semiconductor part, and the holes move to the p-type semiconductor part. Then, the electrons and the holes are collected by the different electrodes respectively connected to the n-type semiconductor part and the p-type semiconductor part. The electrodes are connected to each other using electric wires to thereby obtain electric power.

Several to several tens of solar cells each having the above-described configuration are connected to one another using interconnectors and are configured as a module, in order to increase an amount of electricity generation.

A back contact solar cell in which all of electrodes are formed on a back surface of a semiconductor substrate is configured such that metal lines are attached to the electrodes positioned on the back surface of the semiconductor substrate.

However, when the metal lines are attached to the back surface of the solar cell, there is a problem that the metal lines and the electrodes are not properly attached to each other and are disconnected from each other because of a difference in physical properties, for example, a difference in a thermal expansion coefficient between the metal lines and the semiconductor substrate.

SUMMARY OF THE INVENTION

Accordingly, an object of the present disclosure is to address the above-described and other problems, and embodiments of the invention provide a solar cell module having a structural stability capable of being used for a long time.

In one aspect, there is provided a solar cell module including a plurality of solar cells each including a semiconductor substrate and first and second electrodes on the semiconductor substrate, the first and second electrodes being alternately positioned in a first direction and extended in a second direction intersecting the first direction, a first conductive line extended in the first direction to intersect the first and second electrodes in each solar cell, connected to the first electrode at an intersection between the first electrode and the first conductive line by a first conductive layer, and insulated from the second electrode at an intersection between the second electrode and the first conductive line by an insulating layer, and a second conductive line positioned in parallel with the first conductive line, connected to the second electrode at an intersection between the second electrode and the second conductive line by the first conductive layer, and insulated from the first electrode at an intersection between the first electrode and the second conductive line by the insulating layer, wherein the first and second electrodes each includes a bridge electrode connecting adjacent first electrodes or adjacent second electrodes, wherein each of the first and second conductive lines is attached to the bridge electrode by a second conductive layer.

In another aspect, there is provided a solar cell including a semiconductor substrate, a semiconductor layer formed on a back surface of the semiconductor substrate, the semiconductor layer including a first conductive region and a second conductive region, and first electrodes and second electrodes disposed on the semiconductor substrate, the first and second electrodes being alternately positioned in a first direction and extended in a second direction intersecting the first direction, wherein the first and second electrodes each includes a bridge electrode connecting adjacent first electrodes or adjacent second electrodes, wherein the bridge electrode includes a first bridge electrode connecting at least two first electrodes adjacent to a first side of the semiconductor substrate, a second bridge electrode connecting at least two second electrodes adjacent to a second side opposite the first side of the semiconductor substrate.

According to at least one aspect of the present disclosure, the conductive line is attached to the bridge electrode connecting at least two electrodes. Hence, even when a deformation force resulting from a stress is generated in the solar cell, the deformation force can be efficiently distributed to the conductive layer, and a disconnection between the electrode and the conductive line can be prevented.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
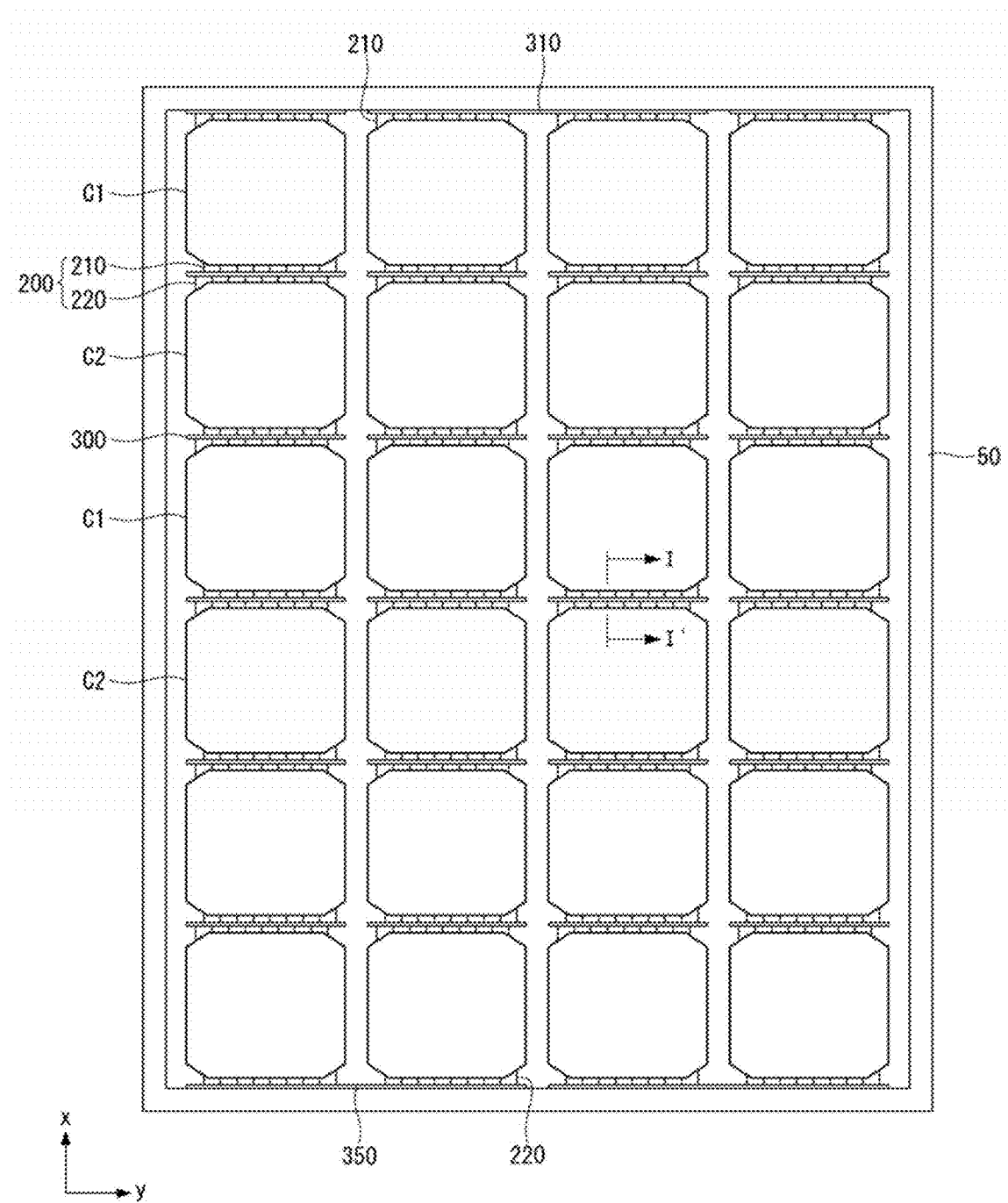
FIG. 1 schematically illustrates a whole front shape of a solar cell module according to an embodiment of the invention.

Reference will now be made in detail to embodiments of the invention, examples of which are illustrated in the accompanying drawings. This invention may, however, be embodied in many different forms and should not be construed as limited to the embodiments set forth herein.

Wherever possible, the same reference numbers will be used throughout the drawings to refer to the same or like parts. It will be noted that a detailed description of known arts will be omitted if it is determined that the detailed description of the known arts can obscure the embodiments of the invention. In addition, various embodiments illustrated in the drawings are illustrative and may not be illustrated to actual scale for convenience of explanation. The shape or structure may also be illustrated by simplicity.

Figure 2:
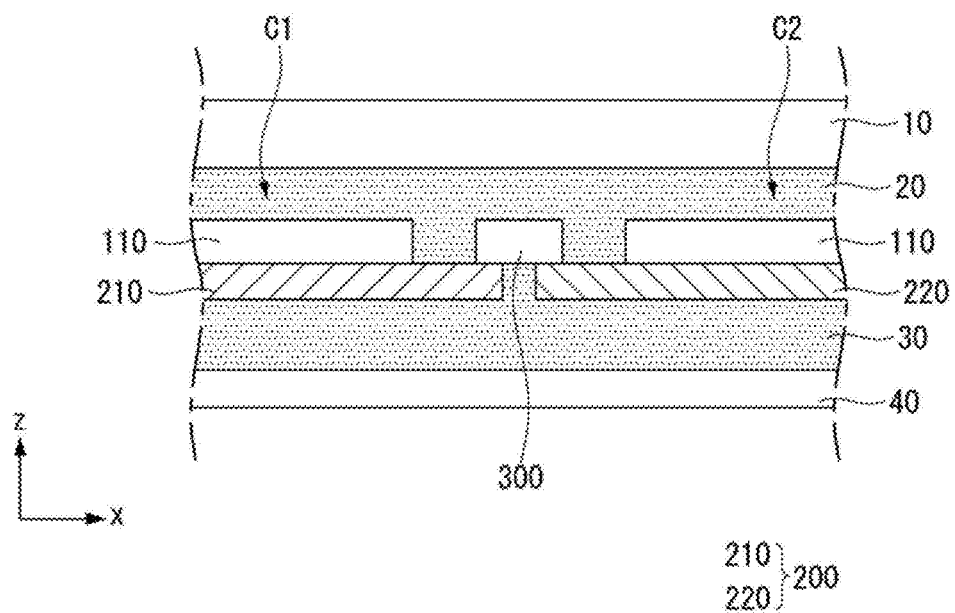
FIG. 2 is a schematic cross-sectional view taken along line I-I' of FIG. 1.

FIG. 1 schematically illustrates a whole front shape of a solar cell module according to an embodiment of the invention. FIG. 2 is a schematic cross-sectional view taken along line I-I' of FIG. 1.

Referring to FIGS. 1 and 2, a solar cell module according to an embodiment of the invention includes a plurality of solar cells and a plurality of first and second conductive lines 200.

In addition, the solar cell module may further include an interconnector 300 connecting the plurality of solar cells in series to each other in a first direction (for example, an x-axis direction in the drawings), a front transparent substrate 10 encapsulating a cell string that is configured such that the plurality of solar cells is connected in series to each other, encapsulants 20 and 30, a back sheet 40, and a frame 50.

As shown in FIG. 1, each of the plurality of solar cells may be extended in the first direction and may include a semiconductor substrate 110 and a plurality of first and second electrodes 141 and 142 on a back surface of the semiconductor substrate 110. It may be preferable, but not required, that the solar cell according to the embodiment of the invention is implemented as a back contact solar cell in which both the first electrodes 141 and the second electrodes 142 are positioned on the back surface of the semiconductor substrate 110.

As shown in FIGS. 1 and 2, the plurality of first and second conductive lines 200 may be connected to a back surface of each solar cell.

As shown in FIGS. 1 and 2, the plurality of solar cells, to which the plurality of first and second conductive lines 200 are connected, may be connected in series to each other in a first direction by the interconnector 300.

For example, the interconnector 300 may connect in series first and second solar cells C1 and C2 that are positioned adjacent to each other in the first direction among the plurality of solar cells.

In this instance, as shown in FIG. 2, front surfaces of a plurality of first conductive lines 210 connected to the first solar cell C1 and front surfaces of a plurality of second conductive lines 220 connected to the second solar cell C2 may be connected to a back surface of the interconnector 300. Hence, the plurality of solar cells may be connected in series to form a cell string.

As shown in FIG. 2, the cell string may be thermally pressed and laminated in a state where the cell string is disposed between the front transparent substrate 10 and the back sheet 40.

For example, a lamination process simultaneously applying heat and pressure may be performed in a state where the plurality of solar cells is disposed between the front transparent substrate 10 and the back sheet 40, and the encapsulants 20 and 30 of a transparent material such as a polymer sheet (for example, ethylene vinyl acetate (EVA)) are disposed on the front surfaces and the back surfaces of the plurality of solar cells. Hence, the components of the solar cell module may be integrated and encapsulated.

As shown in FIG. 1, edges of the front transparent substrate 10, the encapsulants 20 and 30, and the back sheet 40, that are encapsulated through the lamination process, can be fixed and protected by the frame 50.

Each cell string may be extended in the first direction. The plurality of cell strings may be spaced apart from one another in a second direction (for example, an y-axis direction in the drawings) intersecting the first direction and may be connected in series to one another in the second direction by a bushing bar 310 extended in the second direction.

The front transparent substrate 10 may be formed of a tempered glass, etc. having a high transmittance and an excellent damage prevention function.

The back sheet 40 can prevent moisture and oxygen from penetrating into the back surfaces of the solar cells C1 and C2 and protect the solar cells C1 and C2 from an external environment. The back sheet 40 may have a multi-layered structure including a moisture/oxygen penetrating prevention layer, a chemical corrosion prevention layer, etc.

The back sheet 40 may be implemented as a thin sheet formed of an insulating material, such as fluoropolymer/polyester/fluoropolymer (FP/PE/FP). Insulating sheets formed of other insulating materials may be used for the back sheet 40.

The lamination process may be performed in a state where the sheet-shaped encapsulants 20 and 30 are respectively disposed between the front transparent substrate 10 and the solar cells C1 and C2 and between the solar cells C1 and C2 and the back sheet 40.

Figure 3:
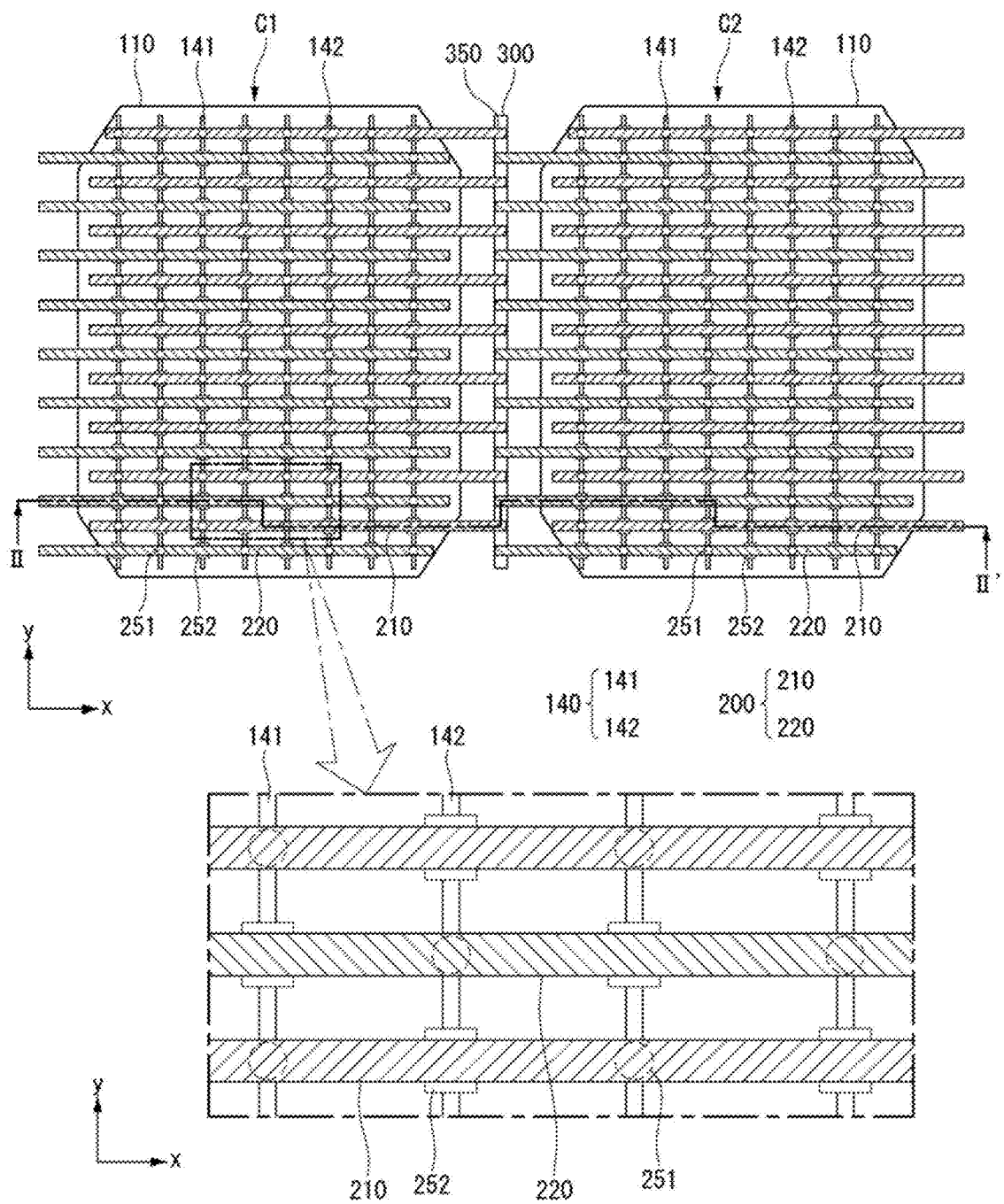
FIG. 3 schematically illustrates a back shape of solar cells which are connected by an interconnector and a conductive line.

In embodiments disclosed herein, the encapsulants 20 and 30 may be formed of a material different from a material of an insulating layer 252 of FIG. 3. The encapsulants 20 and 30 may be formed of a material (for example, ethylene vinyl acetate (EVA)) capable of preventing a corrosion resulting from moisture penetration and absorbing an impact to protect the solar cells C1 and C2 from the impact.

The sheet-shaped encapsulants 20 and 30 disposed between the front transparent substrate 10 and the solar cells C1 and C2 and between the solar cells C1 and C2 and the back sheet 40 may be softened and cured by heat and pressure during the lamination process.

Hereinafter, a structure of the solar cell module shown in FIGS. 1 and 2, in which the plurality of solar cells is connected in series by the conductive lines 200 and the interconnector 300, is described in detail.

Figure 4:
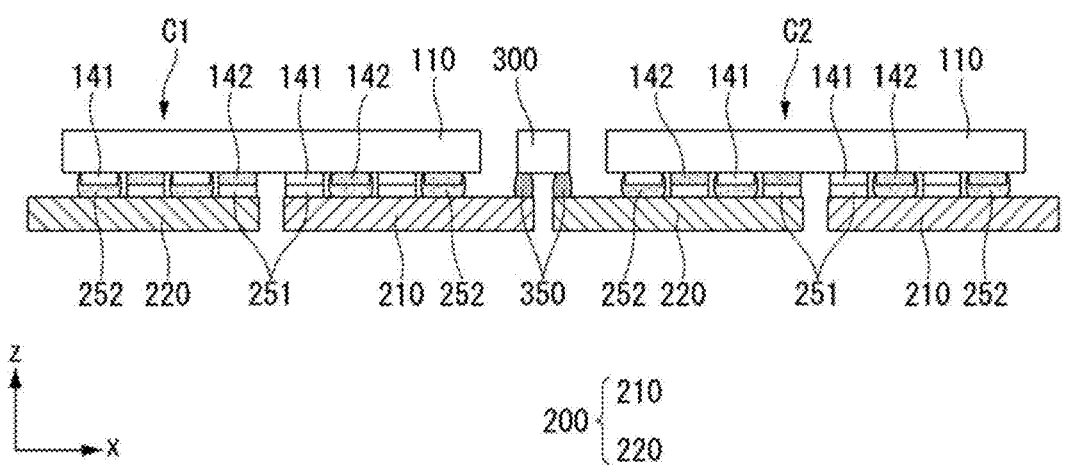
FIG. 4 is a schematic cross-sectional view taken along line II-II' of FIG. 3.

FIG. 3 schematically illustrates a back shape of solar cells which are connected by an interconnector and a conductive line. FIG. 4 is a schematic cross-sectional view taken along line II-II' of FIG. 3. FIGS. 3 and 4 show the simplified representation of the components for convenience of explanation. Thus, the components shown in FIGS. 3 and 4 may be represented differently from some components or implementations thereof.

As shown in FIGS. 3 and 4, a plurality of conductive lines 200 may be connected to back surfaces of semiconductor substrates 110 included in first and second solar cells C1 and C2.

The first and second solar cells C1 and C2 may be arranged to be spaced apart from each other in the first direction. As shown in FIG. 4, each of the first and second solar cells C1 and C2 may at least include a plurality of electrodes 140, including a plurality of first and second electrodes 141 and 142 that are spaced apart from each other on the back surface of the semiconductor substrate 110 and are extended in the second direction. The first electrodes 141 and the second electrodes 142 may be alternately arranged in the second direction.

The plurality of first and second conductive lines 200 may be disposed to extend in a direction (i.e., the first direction) intersecting the first and second electrodes 141 and 142 of each of the first and second solar cells C1 and C2 and may be connected to each of the first and second solar cells C1 and C2. The plurality of first and second conductive lines 200 may include a plurality of first conductive lines 210 that intersects and overlaps the plurality of first electrodes 141 included in each of the first and second solar cells C1 and C2 and is connected to the first electrodes 141, and a plurality of second conductive lines 220 that intersects and overlaps the plurality of second electrodes 142 included in each of the first and second solar cells C1 and C2 and is connected to the second electrodes 142.

More specifically, in each of the plurality of solar cells C1 and C2, the plurality of first conductive lines 210 may be connected to the first electrodes 141 at a plurality of intersections between the first conductive lines 210 and the first electrodes 141 through a conductive layer 251 formed of a conductive material, and may be insulated from the second electrodes 142 at a plurality of intersections between the first conductive lines 210 and the second electrodes 142 through an insulating layer 252 formed of an insulating material. In embodiments disclosed herein, the conductive layer 251 may include a second conductive layer connecting a bridge electrode to the conductive line 200 and a first conductive layer between the first and second electrodes 141 and 142 and the conductive line 200. The conductive layer will be described in detail later.

The conductive layer 251 may include the first conductive layer and the second conductive layer as described above, and each of the first and second conductive layers may be formed by thermally curing a conductive adhesive. The conductive adhesive may include a polymer material and conductive filler particles as a main component and may attach or electrically connect the components by the mechanical and physical contact of the conductive filler particles. The conductive adhesive may be implemented as a paste adhesive or a cream adhesive by mixing a solder power and a flux.

Further, in each of the plurality of solar cells C1 and C2, the plurality of second conductive lines 220 may be connected to the second electrodes 142 at a plurality of intersections between the second conductive lines 220 and the second electrodes 142 through the conductive layer 251 and may be insulated from the first electrodes 141 at a plurality of intersections between the second conductive lines 220 and the first electrodes 141 through the insulating layer 252.

Each of the first and second conductive lines 200 may be formed of a conductive metal material and may include a conductive metal including one of gold (Au), silver (Ag), copper (Cu) and aluminum (Al), and a solder layer which is covered with the conductive metal and is formed of a solder material. It may be preferable, but not required, that the conductive metal is copper (Cu). Further, the solder layer may be formed of various kinds of commonly used solder materials including Sn—Cu based solder, Sn—Ag based solder, Sn—Ag—Cu based solder, Sn—Ag—Bi based solder, Sn—Ag—Bi—In based solder, Sn—Ag—Zn based solder, Sn—Zn based solder, Sn—Bi based solder, Sn—In based solder, etc. More preferably, the solder layer may use a solder material having a melting point within a temperature range of the lamination process, so that the solder layer can be attached to the conductive metal in the lamination process. Other solder materials and temperature ranges are also usable The first conductive lines 210 may be disposed across the first solar cell C1, and an end of each first conductive line 210 may be positioned on the interconnector 300. The second conductive lines 220 may be disposed across the second solar cell C2, and an end of each second conductive line 220 may be positioned on the interconnector 300. It may be preferable, but not required, that the first conductive lines 210 and the second conductive lines 220 are positioned on the same surface of the interconnector 300. Further, it may be preferable, but not required, that each of the plurality of first and second conductive lines 200 has a ribbon shape in which a width of a cross section is greater than a thickness of the cross section.

A linewidth of each conductive line 200 shown in FIGS. 3 and 4 may be 0.5 mm to 2.5 mm in consideration of a reduction in the manufacturing cost while maintaining a line resistance of the conductive line 200 at a sufficiently low level. A distance between the first and second conductive lines 210 and 220 may be 4 mm to 6.5 mm in consideration of a total number of conductive lines 200, so that a short circuit current of the solar cell module is not damaged.

The number of each of the first and second conductive lines 210 and 220 connected to one solar cell may be 10 to 20. Thus, a sum of the number of first and second conductive lines 210 and 220 connected to one solar cell may be 20 to 40.

The insulating layers 252 may be positioned between the first conductive lines 210 and the second electrodes 142 at a plurality of intersections between the first conductive lines 210 and the second electrodes 142 and between the second conductive lines 220 and the first electrodes 141 at a plurality of intersections between the second conductive lines 220 and the first electrodes 141.

Further, the insulating layers 252 positioned at the plurality of intersections between the first conductive lines 210 and the second electrodes 142 and at the plurality of intersections between the second conductive lines 220 and the first electrodes 141 may be spaced apart from one another.

The insulating layers 252 may be made of any material as long as an insulating material is used. For example, the insulating layers 252 may use one insulating material of an epoxy-based resin, polyimide, polyethylene, an acrylic-based resin, and a silicon-based resin.

One end of each of the plurality of first and second conductive lines 200 may be connected to the interconnector 300 and may connect the plurality of solar cells in series.

More specifically, the interconnector 300 may be positioned between the first and second solar cells C1 and C2 and may extend in the second direction. The interconnector 300 may be disposed between the semiconductor substrate 110 of the first solar cell C1 and the semiconductor substrate 110 of the second solar cell C2 when viewed from the plane of the solar cell.

One end of the first conductive line 210 connected to the first electrode 141 of the first solar cell C1 and one end of the second conductive line 220 connected to the second electrode 142 of the second solar cell C2 may be commonly connected to the interconnector 300. The first and second solar cells C1 and C2 may be connected in series to each other in the first direction.

One end of each of the first and second conductive lines 210 and 220 may overlap the interconnector 300 and may be attached to the interconnector 300 through a conductive layer 350. The conductive layer 350 attaching the first and second conductive lines 210 and 220 to the interconnector 300 may be the same as the above-described conductive layer 251.

Because the solar cell module having the above-described structure includes the separate interconnector 300, when a bad connection between the first and second conductive lines 200 and the first and second electrodes 141 and 142 is generated among the plurality of solar cells, the first and second conductive lines 200 of a solar cell having the bad connection may be disconnected from the interconnector 300. Hence, only the bad solar cell can be easily replaced.

Figure 5:
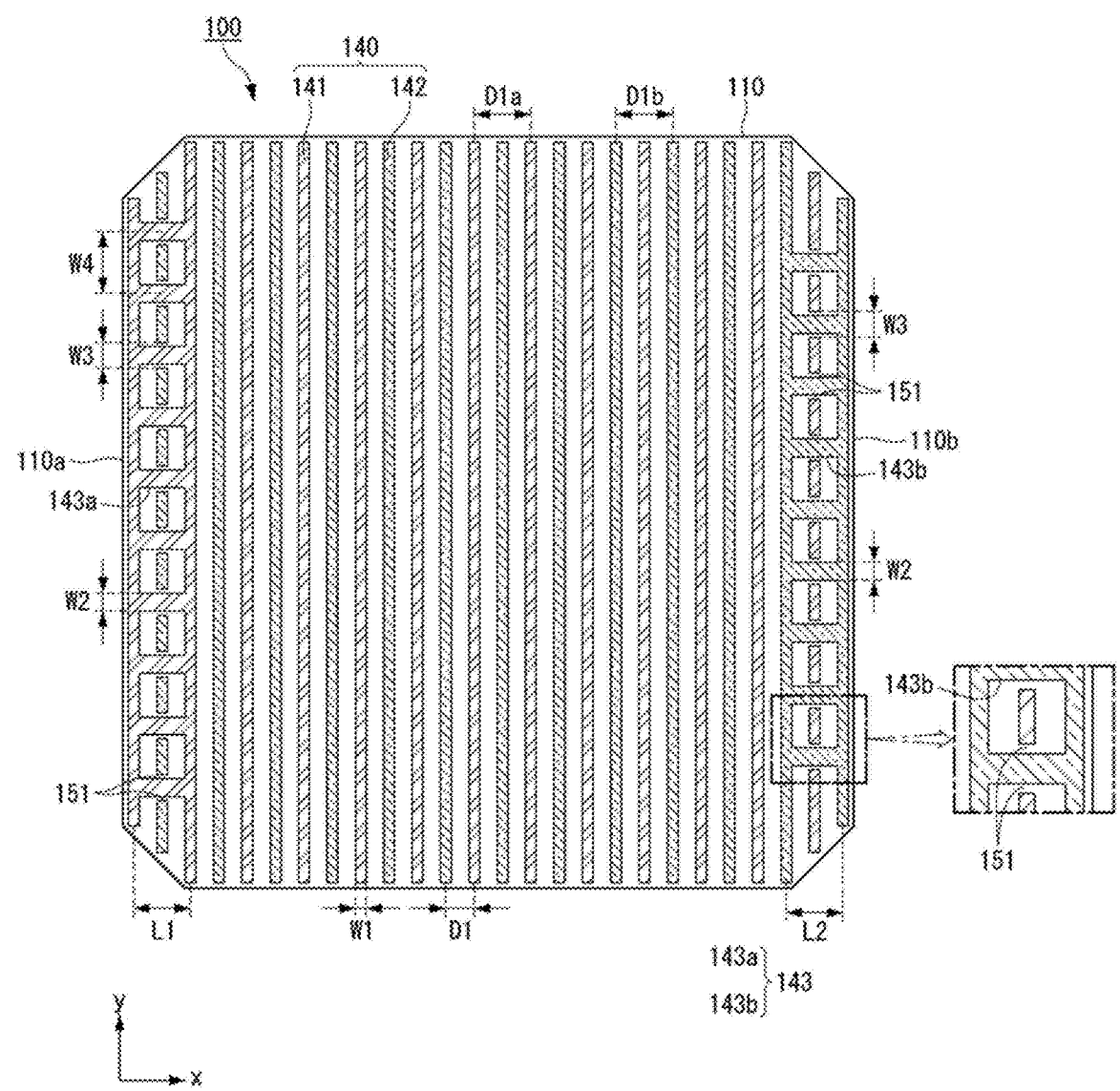
FIG. 5 illustrates a back shape of a solar cell used in a solar cell module shown in FIG. 1.

An electrode structure of a solar cell used in an embodiment of the invention is described below with reference to FIG. 5. FIG. 5 illustrates a back shape of a solar cell used in the solar cell module shown in FIG. 1. Since electrodes of the solar cell shown in FIG. 5 and figures subsequent to FIG. 5 are simplified for convenience of explanation, a structure of the electrodes shown in the figures may be different from an implemented structure.

It may be preferable, but not required, that a solar cell 100 shown in FIG. 5 is implemented as a back contact solar cell in which both first electrodes 141 and second electrodes 142 are positioned on a back surface of a semiconductor substrate 110.

The first electrodes 141 and the second electrodes 142 may be alternately disposed in the first direction and arranged in parallel with each other. The first electrodes 141 and the second electrodes 142 may be extended in the second direction to form a stripe arrangement as a whole.

Each of the first and second electrodes 141 and 142 may have a linewidth W1 of 200 μm to 400 μm. In this instance, a distance (or pitch) D1 between the first electrode 141 and the second electrode 142 may be 400 μm to 600 μm. As a result, a distance D1a between the first electrodes 141 and a distance D1b between the second electrodes 142 may be each 800 μm to 1,200 μm. In embodiments disclosed herein, the distances D1, D1a and D1b between the electrodes are measured based on a center line of each electrode. However, embodiments are not limited thereto. For example, the distances may be adjusted depending on a size of the semiconductor substrate 110, a thickness of the electrode, and the like.

The first and second electrodes 141 and 142 may each selectively further include a bridge electrode 143 connecting the adjacent first electrodes 141 to one another in the first direction or connecting the adjacent second electrodes 142 to one another in the first direction. The bridge electrode 143 may have a linewidth W2 greater than the linewidth W1 of the first and second electrodes 141 and 142. It may be preferable, but not required, that the linewidth W2 of the bridge electrode 143 is equal to or greater than a linewidth of a conductive line 200. The conductive line 200 is positioned on the bridge electrode 143 and is connected to the bridge electrode 143 by a conductive layer 251. Therefore, it is preferable, but not required, that the linewidth W2 of the bridge electrode 143 is 1 to 1.3 times the linewidth of the conductive line 200 in consideration of a process margin and an alignment.

A length L1 of a first bridge electrode 143a may be equal to the distance D1a between the first electrodes 141, and a length L2 of a second bridge electrode 143b may be equal to the distance D1b between the second electrodes 142. By minimizing a size of a disconnection portion 151 of the first electrodes 141 or the second electrodes 142, a reduction in efficiency of the solar cell resulting from the disconnection portion 151 can be minimized. In embodiments disclosed herein, the disconnection portion or portions 151 may be portions of the first electrodes 141 or the second electrodes 142. For example, the disconnection portion or portions 151 may be the first electrodes 141 or the second electrodes 142 in a divided arrangement. In embodiments disclosed herein, the length L1 of the first bridge electrode 143a and the length L2 of the second bridge electrode 143b are measured based on a center line of each of the first and second electrodes 141 and 142.

The bridge electrode 143 can be securely attached to the conductive line 200 by increasing a contact area between the bridge electrode 143 and the conductive line 200. Further, the bridge electrode 143 can prevent the conductive layer 251 from being detached from the electrodes and the conductive line 200 due to a stress generated when the conductive line 200 is thermally expanded and contracted in a longitudinal direction of the conductive line 200, thereby preventing a short-circuit between the electrodes and the conductive lines 200.

More specifically, because both the first and second electrodes 141 and 142 are positioned on the back surface of the semiconductor substrate 110, the stress resulting from the thermal expansion and contrast is transferred along a longitudinal direction of the first and second electrodes 141 and 142 and makes the semiconductor substrate 110 bent. The bending of the semiconductor substrate 110 acts as a stress on the conductive layer 251 attaching the electrodes 141 and 142 to the conductive lines 200, and as a result, the conductive layer 251 is detached from the electrodes 141 and 142 or the conductive lines 200. The problem occurs severely at the side of the semiconductor substrate 110 to which an end of the conductive line 200 is attached. This can be clearly seen in FIG. 6.

Figure 6:
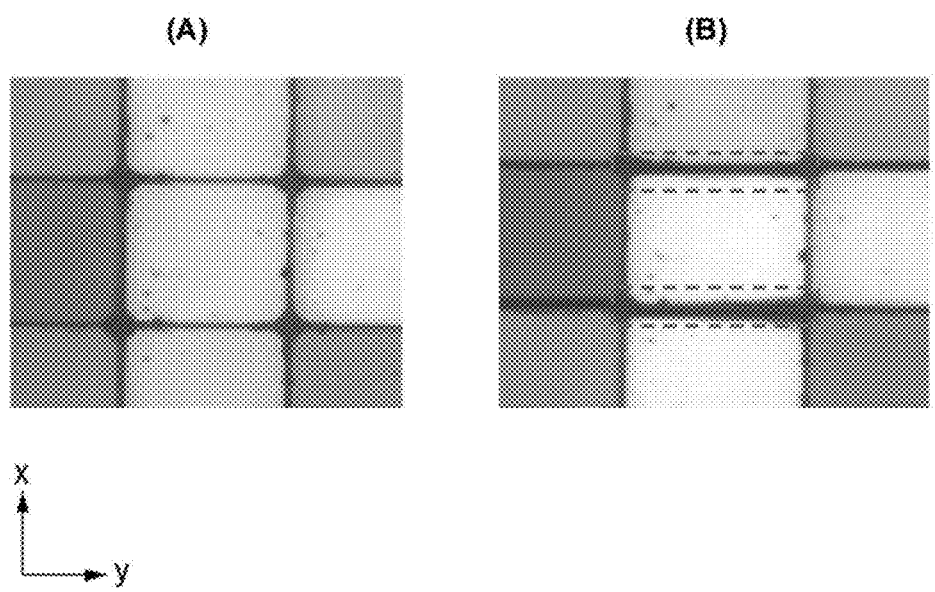
FIG. 6 illustrates images of an electroluminescence (EL) test conducted before and after a thermal cycle test, in order to verify reliability of a solar cell.

FIG. 6 illustrates images of an electroluminescence (EL) test conducted before and after a thermal cycle test, in order to verify reliability of the solar cell. More specifically, (A) of FIG. 6 is an EL photograph of the solar cell module before the thermal cycle test, and (B) of FIG. 6 is an EL photograph of the solar cell module after the thermal cycle test is conducted 600 times. In embodiments disclosed herein, the EL test is a test to determine whether or not a defect is present by distinguishing microcracks, shunt, finger interruption, and the like when electricity is artificially given to the solar cell.

The photographs of FIG. 6 show the front of the solar cell module, and the x-axis of FIG. 6 indicates a connection direction of the conductive line. The reliability test of FIG. 6 was conducted when there is no bridge electrode.

As shown in FIG. 6 which illustrates a comparison of the EL photographs obtained before and after the thermal cycle test, after the thermal cycle test is conducted 600 times, a dark portion (indicated by dotted box of (B) of FIG. 6) in an adjacent portion of the solar cell increases. Hence, an effective emission area decreases.

This indicates that the side of the solar cell (i.e., the end of the conductive line adjacently attached to the side of the solar cell) is detached from the electrode in the reliability test.

Accordingly, the solar cell according to the embodiment of the invention can be configured to further include the bridge electrode 143, in order to solve the above-described problem.

The bridge electrode 143 may include the first bridge electrode 143a connecting at least two first electrodes 141 adjacent to a first side 110a of the semiconductor substrate 110 and the second bridge electrode 143b connecting at least two second electrodes 142 adjacent to a second side 110b of the semiconductor substrate 110.

FIG. 5 illustrates that the first bridge electrode 143a connects the two first electrodes 141 immediately adjacent to the first side 110a, and the second bridge electrode 143b connects the two second electrodes 142 immediately adjacent to the second side 110b, by way of example. However, embodiments are not limited thereto. For example, the number of electrodes connected by the bridge electrode may vary depending on the size of the solar cell, the linewidth of the electrode, the pitch of the electrode, and the like.

A distance W4 between the first bridge electrodes 143a may be substantially the same as a distance between the first conductive lines or a distance between the second conductive lines. In embodiments disclosed herein, the distance W4 between the first bridge electrodes 143a refers to a distance between a center of the first bridge electrode 143a and a center of the first bridge electrode 143a.

Because the second electrode 142 is positioned between the first electrodes 141, the second electrode 142 is configured to include the disconnection portion 151 in which portions of the second electrode 142 is separated and disconnected, in order to prevent a short circuit between the first and second electrodes 141 and 142 resulting from the first bridge electrode 143a. The disconnection portion 151 is formed as an intersection of the first bridge electrode 143a and the second electrode 142, and a width W3 of the disconnection portion 151 has to be greater than a width W2 of the first bridge electrode 143a. It is preferable, but not required, that the disconnection portion 151 is formed at every first bridge electrode 143a. The first electrodes 141 and the second electrodes 142 are alternately positioned in the first direction by the disconnection portion 151. The disconnection portion 151 can prevent the short circuit between the first and second electrodes 141 and 142 even when the first bridge electrode 143a connects the first electrodes 141 in the first direction.

The disconnection portion 151 may be formed corresponding to the second bridge electrode 143b. As shown in FIG. 5, the second bridge electrode 143b connects the second electrodes 142 adjacent to the second side 110b of the semiconductor substrate 110 in the first direction. Hence, the first electrode 141 between the second electrodes 142 is configured to include the disconnection portion 151 in the same manner as the second electrode 142.

Because the first and second bridge electrodes 143a and 143b are respectively positioned adjacent to the sides 110a and 110b of the semiconductor substrate 110 as described above, a start end of a first conductive line and a start end of a second conductive line may be respectively positioned at the first and second bridge electrodes 143a and 143b each having an increasing area. The first and second conductive lines and the first and second bridge electrodes 143a and 143b can be securely coupled with each other by the conductive layer 251 to solve the above-described problem. This is described in detail below.

FIG. 5 illustrates that the bridge electrode 143 is positioned on the side of the semiconductor substrate 110 and is formed corresponding to an end of the conductive line, by way of example. However, embodiments are not limited. For example, the bridge electrode 143 may be formed at various positions in a portion corresponding to the longitudinal direction of the conductive line.

Figure 7:
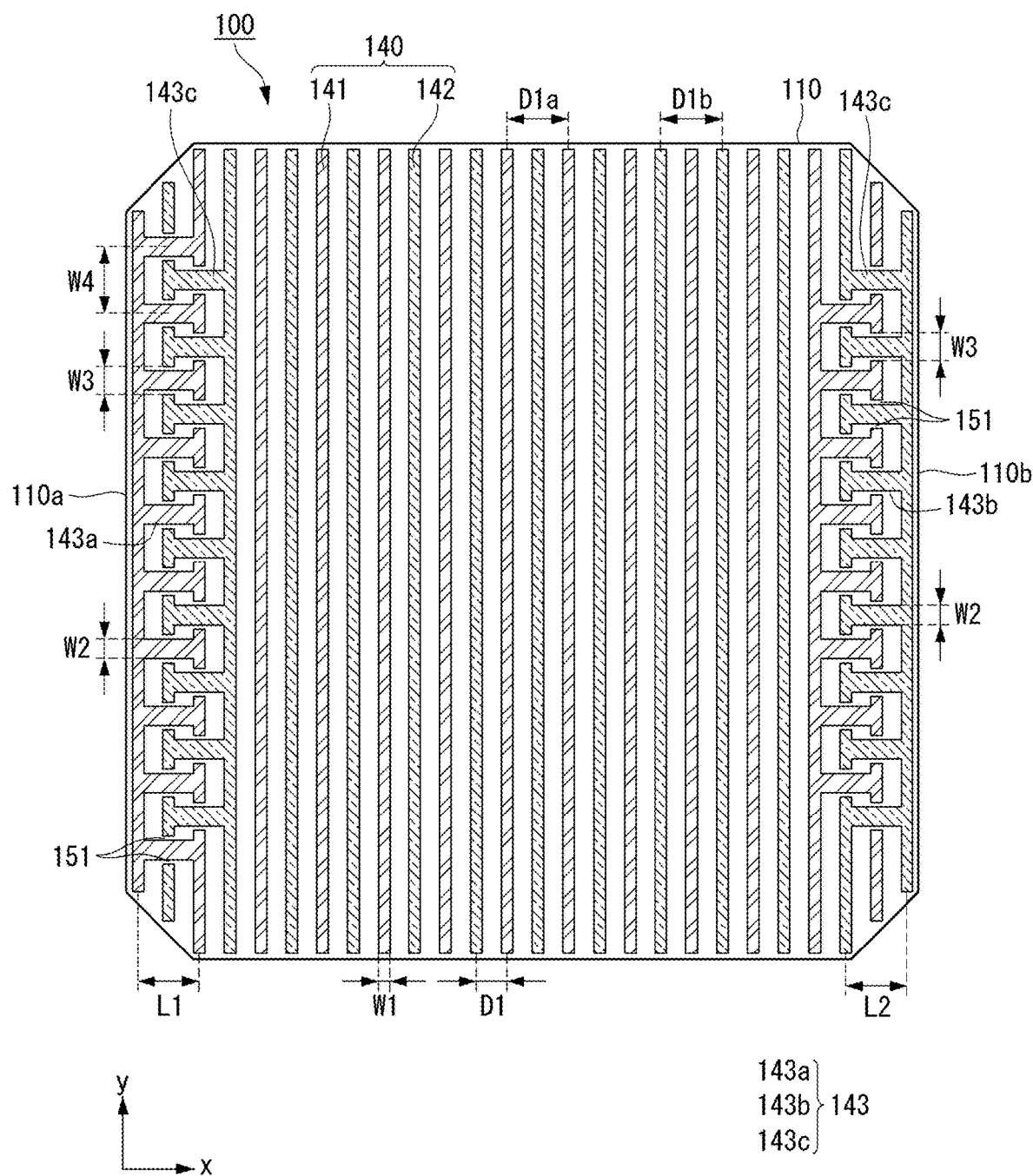
FIGS. 7 and 8 illustrate various examples of a bridge electrode.

FIG. 7 illustrates an example where the bridge electrode 143 is configured to further include a third bridge electrode.

Figure 9:
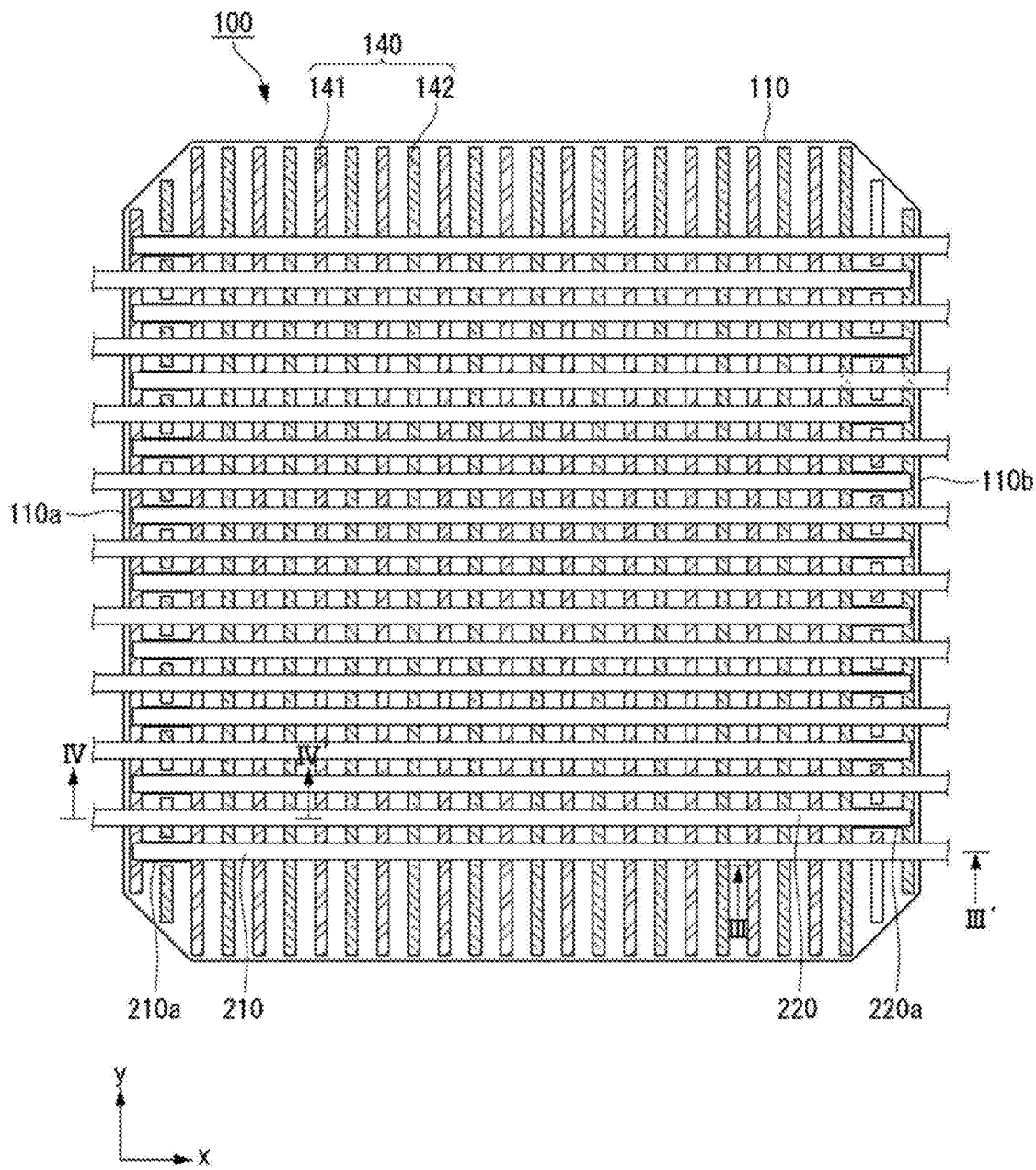
FIG. 9 illustrates a shape of a conductive line attached to a solar cell.

Referring to FIG. 7, a first bridge electrode 143a is positioned adjacent to the first side 110a, connects the first electrodes 141 adjacent to the first side 110a, and is attached to a start end 210a of the first conductive line 210 (see FIG. 9). A third bridge electrode 143c is positioned on the same line as the first bridge electrode 143a in the first direction, is disposed adjacent to the second side 110b, and connects the first electrodes 141 adjacent to the second side 110b. In other words, the third bridge electrode 143c may have the same configuration as the first bridge electrode 143a, except a formation position. Further, the third bridge electrode 143c may be positioned adjacent to the first side 110a and connect the second electrodes 142 adjacent to the first side 110a. In this instance, the third bridge electrode 143c may be positioned on the same line as a second bridge electrode 143b adjacent to the second side 110b in the first direction.

Accordingly, the first conductive line 210 is attached to each of the first and third bridge electrodes 143a and 143c, and the second conductive line 220 is attached to each of the second and third bridge electrodes 143b and 143c. As a result, a portion from which the conductive layer is easily detached can be attached more securely. In FIG. 7, the first electrodes 141 and the second electrodes 142 have interdigitated portions. For example, on the first side 110a, one first electrode 141 is connected to a disconnection portion 151 of another first electrode 141, and one second electrode 142 is connected to a disconnection portion 151 of another second electrode 142. Accordingly, between the one first electrode 141 and the one second electrode 142 that are not in disconnected form, there is present the another first electrode 141 and the another second electrode 142 in disconnected form as disconnection portions 151. A similar arrangement of the first electrodes 141 and the second electrodes 142 is present in the second side 110b.

Figure 8:
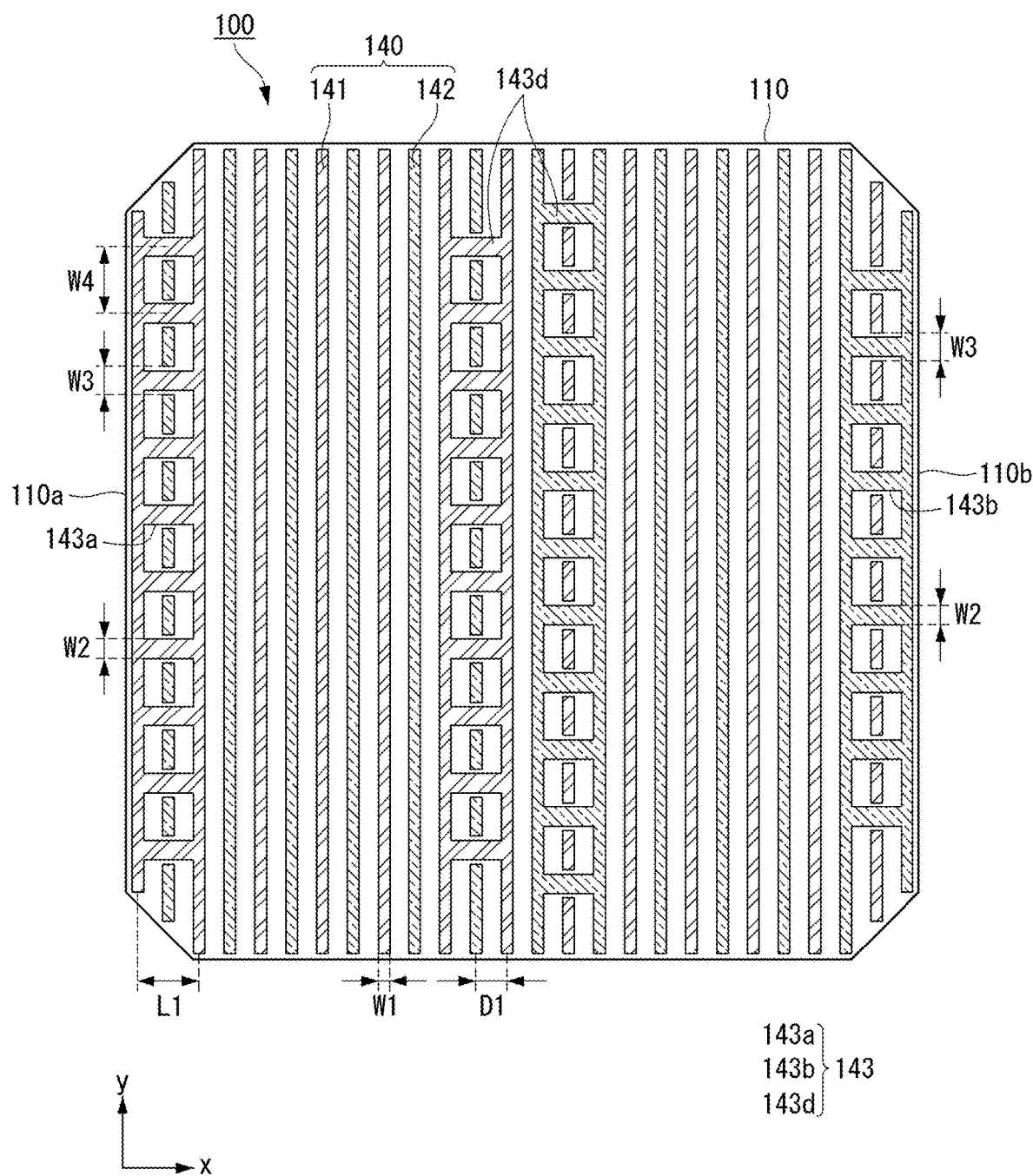

FIG. 8 illustrates an example where the bridge electrode 143 is configured to further include a fourth bridge electrode 143d between a first bridge electrode 143a and a second bridge electrode 143b. Configuration of FIG. 8 is different from configuration of FIG. 5 in that it further includes the fourth bridge electrode 143d. The fourth bridge electrode 143d may be configured to connect the first electrodes 141, connect the second electrodes 142, or connect the first and second electrodes 141 and 142. The configuration of FIG. 8 provides a disconnection portion 151 corresponding to each bridge electrode.

When a high stress is applied to the semiconductor substrate 110, the fourth bridge electrode 143d may be added to the first bridge electrode 143a or the second bridge electrode 143b, in order to efficiently distribute the high stress. Hence, the stress transferred to the semiconductor substrate 110 is distributed to the first bridge electrode 143a and the second bridge electrode 143b and then is distributed to the fourth bridge electrode 143d. As a result, the embodiment of the invention can distribute the stress more efficiently than the configuration of FIG. 5 and prevent more efficiently the conductive layer 251 from being detached from the electrode or the conductive line.

A length W5 of the fourth bridge electrode 143d may be equal to or less than a length of the first bridge electrode 143a or the second bridge electrode 143b, and also a linewidth of the fourth bridge electrode 143d may be equal to or less than a linewidth of the first bridge electrode 143a or the second bridge electrode 143b. Because a disconnection portion 151 is together formed in a portion in which the bridge electrode 143 is formed as described above, carriers cannot be collected at a formation position of the disconnection portion 151. Therefore, an output of the solar cell is reduced. The embodiment of the invention is configured such that the size of the fourth bridge electrode 143d is equal to or less than the sizes of the first and second bridge electrodes 143a and 143b in consideration of a reduction in the output of the solar cell.

FIG. 8 illustrates that the fourth bridge electrode 143d is added to the configuration of FIG. 5, by way of example. However, embodiments are not limited thereto. For example, the fourth bridge electrode 143d may be equally applied to the configuration of FIG. 7.

A structure in which the conductive lines 210 and 220 are attached to the electrodes 141 and 142 by the conductive layer 251 will be described in detail below. The structure is described using an example where the conductive lines are disposed at the electrode structure described with reference to FIG. 5. However, embodiments are not limited thereto. For example, the following description may be equally applied to the electrode structure described with reference to FIGS. 7 and 8, unless there are special restrictions. Also in FIG. 7, the bridge electrodes 143 connect to disconnection portions 151 in a "T" shape. Accordingly, the connections between the bride electrodes 143 and the disconnection portions 151 are perpendicular in FIG. 7, but such is not required, and the connections may be at an angle or at an incline. In FIG. 8, adjacent first electrodes 141 are connected in a matrix shape, and include within the matrix the disconnected portions 151 of the second electrode 142. Similarly, adjacent second electrodes 142 are connected in a matrix shape, and include within the matrix the disconnected portions 151 of the first electrode 141.

Figure 10:
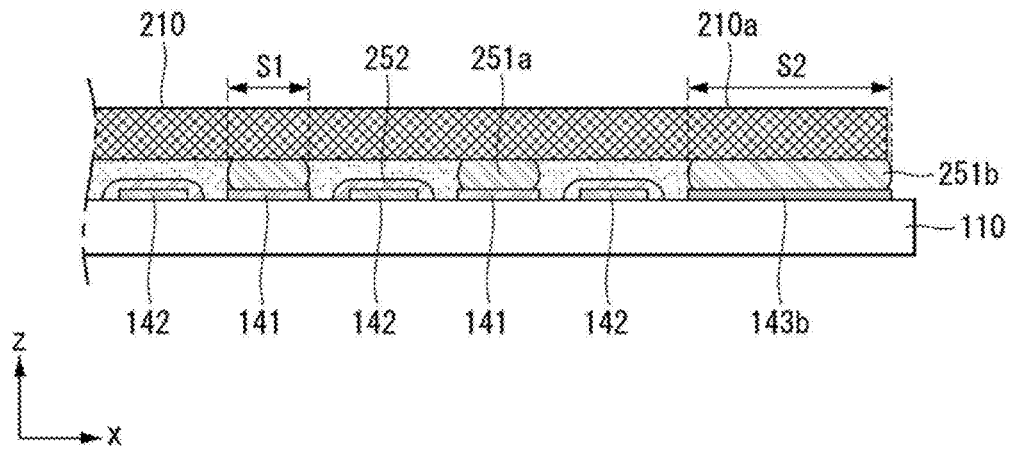
FIG. 10 is a cross-sectional view taken along line III-III' of FIG. 9.
Figure 11:
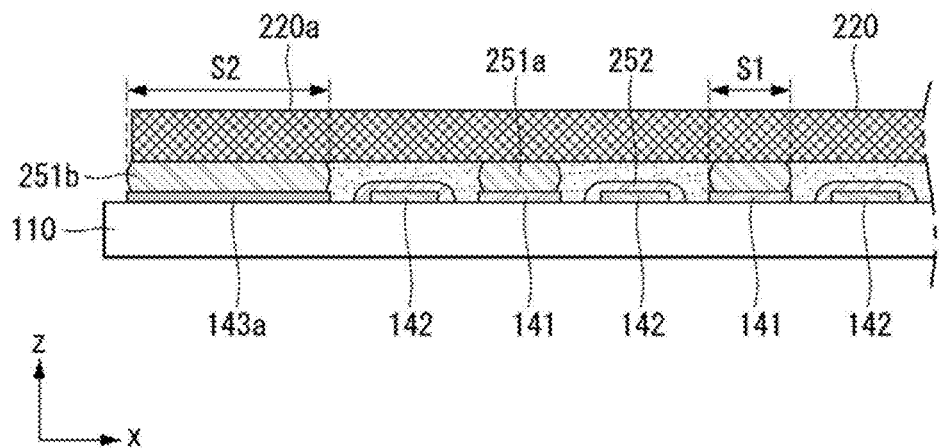
FIG. 11 is a cross-sectional view taken along line IV-IV' of FIG. 9.

FIG. 9 illustrates a shape of a conductive line attached to a solar cell. FIG. 10 is a cross-sectional view taken along line III-III' of FIG. 9. FIG. 11 is a cross-sectional view taken along line IV-IV' of FIG. 9.

Referring to FIGS. 9 to 11, the conductive line 200 includes the first conductive line 210 connected to only the first electrode 141 and the second conductive line 220 connected to only the second electrode 142. The first and second conductive lines 210 and 220 are disposed across the semiconductor substrate 110 in the first direction and are alternately positioned in the second direction.

A start end 210a of the first conductive line 210 is immediately adjacent to the first side 110a of the semiconductor substrate 110 and is positioned inside the semiconductor substrate 110, and another end of the first conductive line 210 protrudes to the outside of the semiconductor substrate 110 across the second side 110b of the semiconductor substrate 110. The start end 210a of the first conductive line 210 may be attached to the first bridge electrode 143a by a second conductive layer 251b, and a remaining portion of the first conductive line 210 may be attached to the first electrodes 141 by a first conductive layer 251a disposed at each position intersecting the first electrodes 141.

On the contrary to the first conductive line 210, a start end 220a of the second conductive line 220 is immediately adjacent to the second side 110b of the semiconductor substrate 110 and is positioned inside the semiconductor substrate 110, and another end of the second conductive line 220 protrudes to the outside of the semiconductor substrate 110 across the first side 110a of the semiconductor substrate 110. The start end 220a of the second conductive line 220 may be attached to the second bridge electrode 143b by the second conductive layer 251b, and a remaining portion of the second conductive line 220 may be attached to the second electrodes 142 by the first conductive layer 251a disposed at each position intersecting the second electrodes 142.

The first bridge electrode 143a is positioned corresponding to the start end 210a of the first conductive line 210, and the first conductive lines 210 and the second conductive lines 220 are alternately disposed in the second direction. Therefore, the first bridge electrode 143a may be positioned between the second conductive lines 220 adjacent to each other in the second direction, and the second bridge electrode 143b may be positioned between the first conductive lines 210 adjacent to each other in the second direction.

Because each of the first and second bridge electrodes 143a and 143b is extended along the longitudinal direction of the first and second conductive lines 210 and 220, an area of the conductive layer 251 for attaching and connecting the bridge electrode and the conductive line can greatly increase along the longitudinal direction of the conductive line. Hence, the stress transferred along the conductive lines 210 and 220 can be efficiently distributed.

More specifically, the first and second conductive lines 210 and 220 are respectively attached to the first and second electrodes 141 and 142 by the first conductive layer 251a having a first width S1. The ends 210a and 220a of the first and second conductive lines 210 and 220 are respectively attached to the first and second bridge electrodes 143a and 143b by the second conductive layer 251b having a second width S2 greater than the first width S1. As shown in FIGS. 9 to 11, the second width S2 of the second conductive layer 251b corresponds to a distance between the first electrodes 141 or a distance between the second electrodes 142, and the first width S1 of the first conductive layer 251a corresponds to a linewidth of the first electrode 141 or a linewidth of the second electrode 142. Therefore, the second width S2 may be about four to five times greater than the first width S1. Thus, a stress transferred along a longitudinal direction (i.e., x-axis direction in the drawings) of the conductive line 200 can be efficiently absorbed in the second conductive layer 251b and can prevent the conductive layer 251 from being detached.

The first and second conductive layers 251a and 251b may be made using the same conductive adhesive. The conductive adhesive used may select conductive particles from various kinds of commonly used solder materials including Sn—Cu based solder, Sn—Ag based solder, Sn—Ag—Cu based solder, Sn—Ag—Bi based solder, Sn—Ag—Bi—In based solder, Sn—Ag—Zn based solder, Sn—Zn based solder, Sn—Bi based solder, Sn—In based solder, and the like in consideration of an adhesive strength between the conductive lines 200 and the electrodes 141 and 142. Other materials are usable.

For example, the first and second conductive layers 251a and 251b may be formed of a solder material having a melting point higher than a melting point of a solder layer of the conductive line 200. In this instance, the first and second conductive layers 251a and 251b may be formed on the electrodes 141 and 142 before a lamination process, and the solder layer of the conductive line 200 having a melting point within a temperature range of the lamination process may be melted during the lamination process and may be coupled to the first and second conductive layers 251a and 251b.

Figure 12:
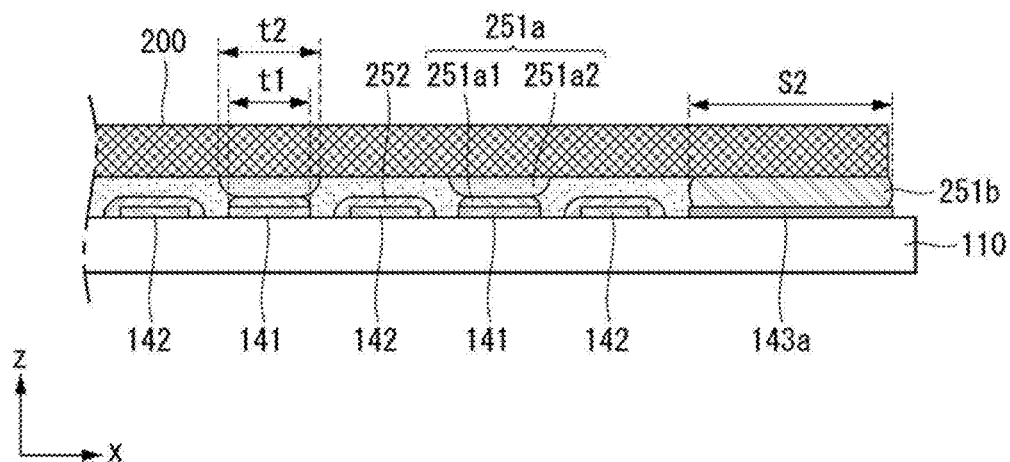
FIG. 12 illustrates an example where a first conductive layer has a two-layer structure.

So far, the embodiment of the invention described the conductive layer 251 formed as one layer. However, the conductive layer 251 may have a two-layer structure including a first layer and a second layer. FIG. 12 illustrates an example where a first conductive layer has a two-layer structure.

Referring to FIG. 12, the first conductive layer 251a may include a first layer 251a1 formed on the first electrode 141 or the second electrode 142 and a second layer 251a2 formed between the first layer 251a1 and the conductive line 200.

The first layer 251a1 and the second layer 251a2 may be formed of different solder materials, and the second layer 251a2 may include the same solder particles as a solder layer of the conductive line 200.

The first layer 251a1 may select a formation material in consideration of an adhesive strength between the first layer 251a1 and the electrodes 141 and 142. It may be preferable, but not required, that a material which has a melting point higher than the temperature of the lamination process and thus does not change during the lamination process is used. For example, a melting point of Sn—Ag—Cu (SAC) solder is about 217° C., the Sn—Ag—Cu (SAC) solder does not generate a phase change during the lamination process if the temperature of the lamination process is 150 to 170° C.

The first layer 251a1 may be formed by thermally curing a conductive adhesive or a conductive paste and may be formed before the lamination process. In this instance, the first layer 251a1 may have a first width t1.

The second layer 251a2 may select a formation material in consideration of an adhesive strength between the second layer 251a2 and the conductive line 200, particularly, the solder layer coated on the conductive line 200. Further, the second layer 251a2 may be attached to the conductive line 200 during the lamination process, in order to simplify the manufacturing process.

The second layer 251a2 may be formed of one of Sn—In based solder material, Sn—Bi based solder material, and Sn—Ag—Bi based solder material. The solder materials have a melting point similar to or lower than the temperature of the lamination process described above. Other materials are usable.

The second layer 251a2 may be formed of the same material as the solder layer of the conductive line 200. In this instance, there is an advantage that the adhesive strength between the second layer 251a2 and the conductive line 200 is very good. When the second layer 251a2 is formed of the same material as the solder layer of the conductive line 200, a solder material for forming the second layer 251a2 and the solder layer of the conductive line 200 are simultaneously melted during the lamination process and are soldered in a combined state therebetween. Hence, the second layer 251a2 has a cross section of which a width gradually increases as it goes toward the conductive line 200. A maximum width t2 of the second layer 251a2 may be greater than the first width t1 of the first layer 251a1.

When the conductive layer includes the first layer and the second layer as described above, the solder material forming each of the first and second layers may be selected suitable for the electrode or the conductive line. Hence, the adhesive strength between the electrodes and the conductive lines can be further improved.

On the other hand, the second conductive layer 251b is formed as a single layer unlike the first conductive layer 251a. The solder materials having a low melting point generally include bismuth (Bi) capable of lowering a melting point. However, bismuth (Bi) has a problem that is easily damaged by a stress due to bad brittleness. Because of this, it is preferable, but not required, that the second conductive layer 251b is formed of the same material as the first layer 251a1 among the first and second layers 251a1 and 251a2 forming the first conductive layer 251a.

Figure 13:
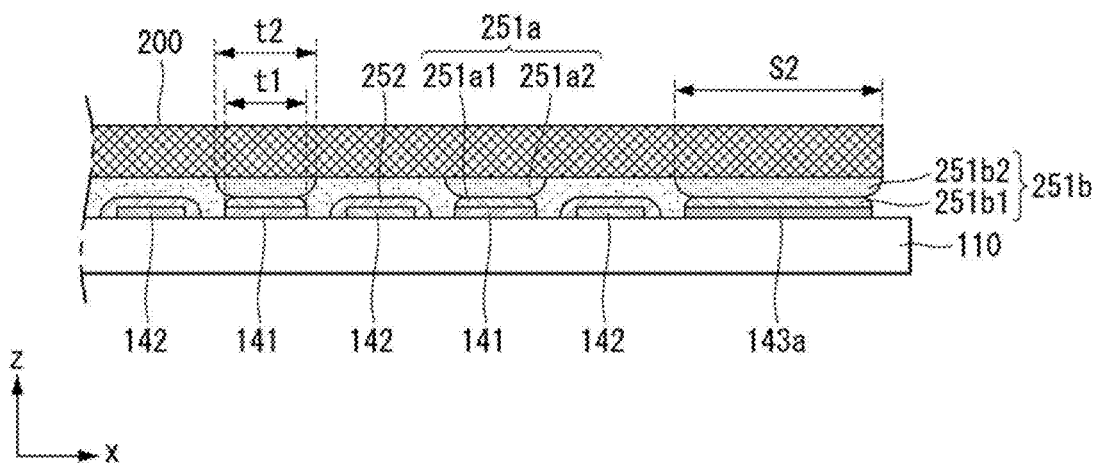
FIG. 13 illustrates an example where a bridge electrode has a double-layered structure.

FIG. 12 illustrates that the second conductive layer 251b is formed as a single layer, by way of example. However, embodiments are not limited thereto. For example, as shown in FIG. 13, the second conductive layer 251b may have a two-layer structure including a first layer 251b1 and a second layer 251b2 on the first layer 251b1 in the same manner as the first conductive layer 251a.

Figure 14:
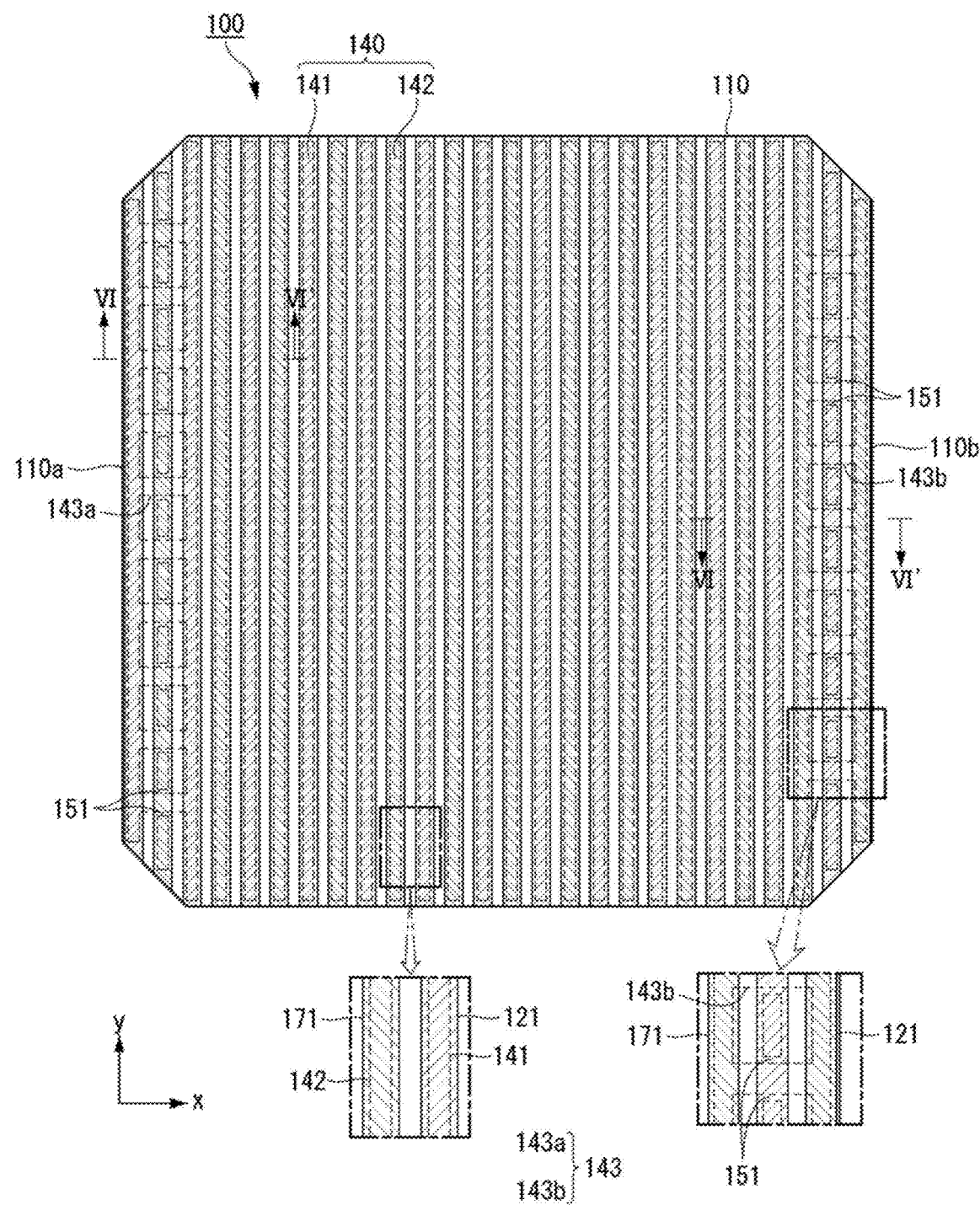
FIG. 14 illustrates electrodes formed on a back surface of a solar cell and a conductive region formed corresponding to each electrode.
Figure 15:
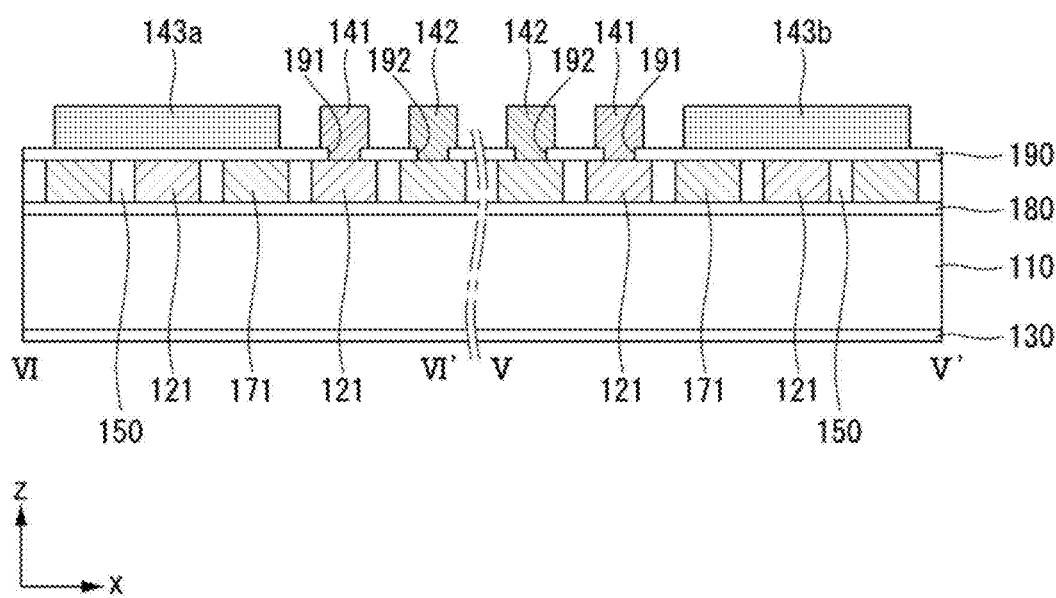
FIG. 15 is a cross-sectional view taken along lines V-V' and VI-VI' of FIG. 14.

An electrode and a conductive region are described below with reference to FIGS. 14 and 15. FIG. 14 illustrates electrodes formed on a back surface of a solar cell and a conductive region formed corresponding to each electrode. FIG. 15 is a cross-sectional view taken along lines V-V' and VI-VI' of FIG. 14.

The first electrodes 141 and the second electrodes 142 are disposed on the back surface of the semiconductor substrate 110, are extended from one end to another end of the semiconductor substrate 110 in the second direction (y-axis direction in the drawings), and are alternately arranged in the first direction (x-axis direction in the drawings).

A conductive region includes a first conductive region 121 and a second conductive region 171 depending on a conductivity type. For example, the first conductive region 121 may be a region having a conductivity type opposite a conductivity type of the semiconductor substrate 110, and a second conductive region 171 may be a region having the same conductivity type as the semiconductor substrate 110. An intrinsic region 150 not containing impurities exists between the first conductive region 121 and the second conductive region 171 and separates the first conductive region 121 from the second conductive region 171. The conductive region may be formed by injecting impurities into a crystalline silicon layer.

The first conductive region 121 is successively extended from one end to another end of the semiconductor substrate 110 in the second direction in the same manner as the first electrode 141. The first conductive region 121 is extended even at the disconnection portion 151 formed on the first electrode 141 in the second direction and is formed corresponding to the disconnection portion 151.

The second conductive region 171 is successively extended from one end to another end of the semiconductor substrate 110 in the second direction in the same manner as the first conductive region 121 and is formed at the disconnection portion 151 formed on the second electrode 142.

Hence, the first conductive region 121 is disposed to intersect the second bridge electrode 143b connecting the first electrodes 141, and the second conductive region 171 is disposed to intersect the first bridge electrode 143a connecting the second electrodes 142. However, a passivation layer 190 formed of an insulating material is present between the conductive region and the bridge electrode and thus can prevent the first and second conductive regions 121 and 171 from being short-circuited by the bridge electrodes 143a and 143b.

The first electrode 141 may be connected to the first conductive region 121 through a first contact hole 191 formed in the passivation layer 190, and the second electrode 142 may be connected to the second conductive region 171 through a second contact hole 192 formed in the passivation layer 190.

The solar cell according to the embodiment of the invention can simplify a pattern of the conductive region by forming the conductive region even at the disconnection portion 151 and thus can be easily manufactured.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
a plurality of solar cells each including a semiconductor substrate and first and second electrodes on the semiconductor substrate, the first and second electrodes being alternately positioned in a first direction and extended in a second direction intersecting the first direction;
a first conductive line extended in the first direction to intersect the first and second electrodes in each solar cell, connected to the first electrode at an intersection between the first electrode and the first conductive line by a first conductive layer, and insulated from the second electrode at an intersection between the second electrode and the first conductive line by an insulating layer; and
a second conductive line positioned in parallel with the first conductive line, connected to the second electrode at an intersection between the second electrode and the second conductive line by the first conductive layer, and insulated from the first electrode at an intersection between the first electrode and the second conductive line by the insulating layer,
wherein each of the first and second electrodes includes a first bridge electrode connecting adjacent two first electrodes disposed adjacent to a first side of the semiconductor substrate and a second bridge electrode connecting adjacent two second electrodes disposed adjacent to a second side opposite the first side of the semiconductor substrate,
wherein the first conductive line is attached to the first bridge electrode by a second conductive layer and the second conductive line is attached to the second bridge electrode by the second conductive layer,
wherein a width of the second conductive layer in the first direction is greater than a distance between neighboring two first electrodes or between neighboring two second electrodes in the first direction,
wherein the second conductive layer is provided between the each of the first and second conductive lines and the each of the first and second bridge electrodes, and
wherein adjacent solar cells of the plurality of solar cells are connected by the first conductive line and the second conductive line.

2. The solar cell module of claim 1, wherein the first bridge electrode is formed at a position where a start end of the first conductive line is disposed, and
wherein the second bridge electrode is formed at a position where a start end of the second conductive line is disposed.

3. The solar cell module of claim 2, wherein the first and second bridge electrodes each includes a third bridge electrode that connects the at least two first electrodes at a position immediately adjacent to the second side or connects the at least two second electrodes at a position immediately adjacent to the first side.

4. The solar cell module of claim 2, wherein the first and second bridge electrodes each includes a fourth bridge electrode that is positioned between the first side and the second side and connects the at least two first electrodes or the at least two second electrodes.

5. The solar cell module of claim 1, wherein a length of the first bridge electrode is the same as a distance between the at least two first electrodes, and a length of the second bridge electrode is the same as a distance between the at least two second electrodes.

6. The solar cell module of claim 1, wherein a linewidth of the bridge electrode is 1 to 1.3 times a linewidth of each of the first and second conductive lines.

7. The solar cell module of claim 1, wherein each of the first and second conductive lines includes a conductive metal and a solder layer covering the conductive metal, and each of the first conductive layer and the second conductive layer is made of a solder material having a melting point higher than a melting point of the solder layer.

8. The solar cell module of claim 7, wherein the first conductive layer includes a first layer and a second layer,
the first layer is attached to the first electrode or the second electrode, and
the second layer is formed on the first layer and has a melting point lower than a melting point of the first layer.

9. The solar cell module of claim 8, wherein the second conductive layer includes a first layer and a second layer in the same manner as the first conductive layer, or is entirely formed of the same material as the first layer of the first conductive layer.

10. The solar cell module of claim 8, wherein the second layer of the first conductive layer is formed of the same material as the solder layer.

11. The solar cell module of claim 1, wherein each of the plurality of solar cells further includes:
a semiconductor layer formed on a back surface of the semiconductor substrate, the semiconductor layer including a first conductive region connected to each of the first electrode and the second electrode, and to a second conductive region; and
a passivation layer covering the semiconductor layer, wherein the bridge electrode is formed on the passivation layer.

12. The solar cell module of claim 11, wherein one of the two adjacent first electrodes and one of the two adjacent second electrodes each includes a disconnection portion which has a width greater than a linewidth of the bridge electrode and is formed in the second direction, and wherein the disconnection portion is disconnected from the bridge electrode or intersects the bridge electrode.

* * * * *